United States Patent [19]
Elster et al.

[11] Patent Number: 4,659,986
[45] Date of Patent: Apr. 21, 1987

[54] ELECTRICAL TEST CONNECTOR FOR SIMULTANEOUS TESTING OF A PLURALITY OF ELECTRICAL COMPONENTS

[75] Inventors: Werner Elster, Gelnahusen; Horst Koch, Mittel-Gründau; Gustav Ost, Hasselroth; Werner Simon, Westergrund; Karl Deckelmann, Aschaffenburg; Ino Taitl, Hasselroth, all of Fed. Rep. of Germany

[73] Assignee: W.C. Heraeus GmbH, Hanau, Fed. Rep. of Germany

[21] Appl. No.: 652,745

[22] Filed: Sep. 19, 1984

[30] Foreign Application Priority Data

Oct. 7, 1983 [DE] Fed. Rep. of Germany ....... 3336502

[51] Int. Cl.[4] ........................................... G01R 31/00
[52] U.S. Cl. ............................... 324/158 F; 339/258 R
[58] Field of Search ............... 324/158 F, 158 P, 72.5, 324/73 R, 158 R; 339/151 B, 258 R, 261, 256 R

[56] References Cited

U.S. PATENT DOCUMENTS

| | | | |
|---|---|---|---|
| 3,009,109 | 11/1961 | Jankowski | 324/158 P |
| 3,382,437 | 5/1968 | Illingsworth | 324/158 R |
| 3,596,180 | 7/1971 | Schmitt | 324/73 R X |
| 3,629,702 | 12/1971 | Henken | 324/158 F X |
| 4,320,339 | 3/1982 | Yancelette | 324/158 F X |

FOREIGN PATENT DOCUMENTS 8304116 8/1984 Fed. Rep. of Germany .
120307 6/1976 German Democratic Rep. .

Primary Examiner—Reinhard J. Eisenzopf
Assistant Examiner—Stephen M. Baker
Attorney, Agent, or Firm—Frishauf, Holtz, Goodman & Woodward

[57] ABSTRACT

To permit testing of electrical connectors mounted on a strip, a pair of jaws, similarly to substantially transversely extended clothespin jaws, are provided, the inside surface of one (A) of the jaws (A, B) carrying a conductive strip (4) adapted to be engaged by one terminal of elements to be tested, the other terminal of the test elements being connected to a test track (7), for example applied over the conductive strip with an intervening insulating layer; (20) individual components (2) can be tested by foreshortening one terminal pin (5b) of the components and extending electrically conductive fingers, preferably of resistance material (6) for spring-clip engagement (8) with the foreshortened pins. The conductive strip (4) and the track (7) are brought out to external accessible terminal connectors (9). Alternatively, the test track is applied to a support strip (1) on which the elements (2) are located.

14 Claims, 1 Drawing Figure

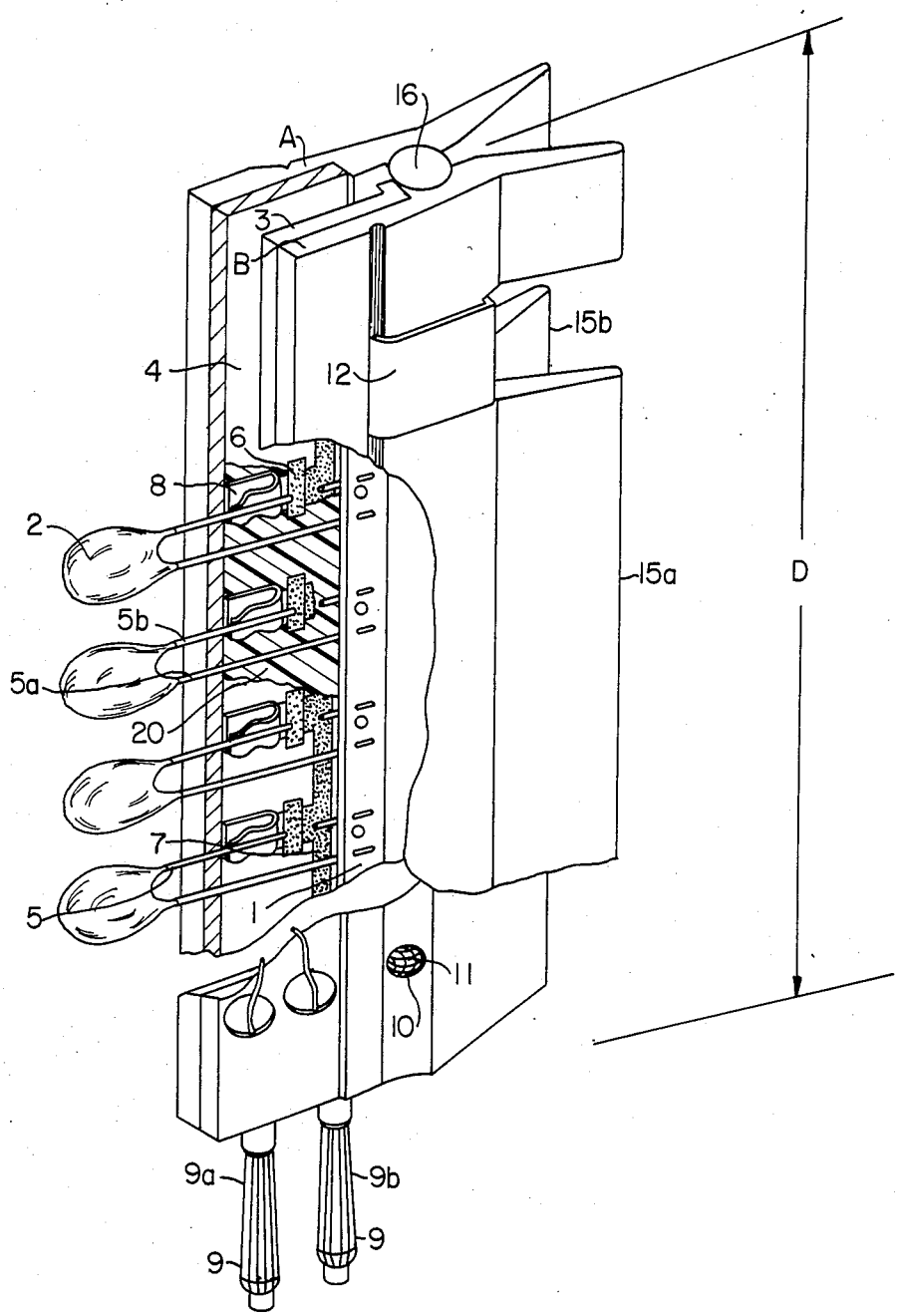

ELECTRICAL TEST CONNECTOR FOR SIMULTANEOUS TESTING OF A PLURALITY OF ELECTRICAL COMPONENTS

The present invention relates to an electrical test connector, and more particularly to an electrical test connector adapted to clamp a plurality of test components, such as capacitors, resistors, or the like, used in electrical and electronic apparatus, and/or to hold said components in place for testing, burn-in, and re-testing, if desired.

BACKGROUND

It has previously been proposed to test a plurality of electrical components by clamping connecting leads from the components in test apparatus which can also be introduced into controlled environments, for example of high heat, humidity, or the like, or high electrical stresses, such as excess voltage and the like, in order to burn in the components and test them after having been exposed, for example, to stressful conditions which may well exceed the normal operating conditions under which they are intended to be used. The test elements are, for example, simultaneously subjected to thermal and electrical stress. In a burn-in apparatus, a predetermined temperature is generated by a hot-air current, for example of up to about 200°, which is maintained for example as a flow of air stream. Simultaneously, the test elements are subjected to electrical voltages, for example to test their operating reliability, insulation capacity, and the like. German Utility Model 83 04 116 describes a test chamber of this type, in which strip-like holding elements are placed into a chamber, the strip-like holding elements retaining the test samples. The outside of the chamber includes electrical connection elements to apply voltage to the test elements.

THE INVENTION

It is an object to provide an electrical test connector, particularly suitable for use with burn-in apparatus of any suitable construction, for example of the type described in the aforementioned referenced German Utility Model No. 83 04 116, which permits a plurality of test elements to be simultaneously subjected to the controlled environment and simultaneously tested, and in which the application of a heated air stream to the test elements is free from impediment while readily permitting connection of electrical test voltages and/or sensing voltages. If necessary, it is possible to decouple each pin of the devices to be tested by a resistor.

Briefly, two elongated clamping jaws movable between a clamped and released position are provided, the clamping arrangement, for example, being similar to clothespins, in which the two clamping jaws are connected by a closing spring. A first guide strip of insulating material is inserted in one of the jaws, a second guide strip of conductive material being arranged in the other one of the jaws, the test elements being clamped between the jaws. A carrier strip can be inserted longitudinally between the clamping jaws. Electrical connections are provided, engageable with the guide strip of conductive material and with one of the contact pins of the components to be tested, which is secured in one of the clamping jaws and is externally accessible. The carrier strip is so arranged that it retains the elements to be tested and provides one of the electrical connections thereto.

DRAWING

The single FIGURE is a pictorial representation, partly broken away, of the test connector in accordance with the present invention, in which the test elements selected as an example are small capacitors.

DETAILED DESCRIPTION

The test connector is formed of two elongated clamp elements A, B, which, in cross section, are shaped similarly to spring-loaded clothespins and may, for example, have approximately the same jaw-to handle dimension and a transverse dimension as desired, to accomodate a desired plurality of test elements 2. The dimension "D" of the drawing will be referred to as the transverse dimension. By compressing projecting wings 15a, 15b towards each other counter the force of a spring 12, the jaws A, B can open, for insertion of test elements 2, illustrated as capacitors, between the jaws A, B.

Each one of the jaws A, B is made of insulating material, for example of hard rubber or the like, or a fiber-reinforced plastic structure; one of the jaws has a connecting or terminal strip inserted therein.

The jaws of both of the connecting elements can be axially shifted with respect to each other, can be separated from each other by compression of the wings 15a, 15b. The clamping jaws A, B and/or the wings 15a, 15b can be additionally surrounded by a protective coating. A holding strip 1 is provided, guided within the jaws. The holding strip 1 forms a carrier for the test elements, as shown, capacitors 2. The strip 1 is electrically connected by a spring-loaded terminal element in the clamping jaw opposite the one which retains the strip 1 in position, and not specifically shown in the drawing. Any suitable arrangement, such as a slide leaf-spring or the like is appropriate. An insulating strip 3 is located in the jaw B, facing a first conductive connecting or contact terminal track or strip 4 in the jaw A. The capacitors 1 have extending connecting leads or pins 5. One of the pins, pin 5a, is directly connected to the holding strip 1. The other one, pin 5b, is foreshortened and engages a contact spring 8, connected to a a resistor element 6 which is formed as a finger-like extension from a second connecting track 7. One each resistor element 6 is located opposite a foreshortened pin 5b, the contact springs 8 engaging the shortened pin 5b.

The clamping arrangement has connecting terminal pins 9 located at the end thereof to permit energizing the test clamp. The contact strip 4, preferably, is made of a silicon-chromium-aluminum alloy; this material has been found particularly suitable. The contact strip 4 may, however, also be made of plastic resin material which has been rendered conductive at the surface thereof, for example by plating or addition of a contact strip. The insulating strip 3 in jaw B may be made of insulating plastic material or of ceramic. Balls 10 are located within openings 11 in order to provide holding elements for the strip 1 in the jaws A and B with respect to each other; the balls are preferably spring-loaded to insure proper seating. End stub shafts or pins may also be provided, inserted for example in a circular matching groove 16 formed, respectively, in the two clamping jaws. A pin inserted in the groove 16 will form the pivot axis for the electrical clamping connector.

It is desirable to connect the elements 2, e.g. capacitors, resistors, or other passive electronic elements by conductive tracks or solder tracks by using thick-film technology. As shown, the elements to be tested are capacitors applied to the strip 1. To obtain resistance pastes or conductive pastes, printing is suitable; the resistors 6 as well as conductive paints and the like may be applied, for example, by thick-film technology. Conductive tracks or paths as well as solder material for soldering can be likewise applied by printing or thickfilm technology. The conductive tracks 4, 7 lead to the connecting pins or prongs 9a, 9b respectively at the end of the conductive strip are so arranged that all resistors 6 are connected, electrically, in parallel. The charge current, upon first connecting the unit, can be sensed; if one of the capacitors should be defective by being internally short-circuited, the total charge current is limited by the resistor or resistors connected to the respective capacitor. The resistors 6 are preferably so arranged that they are high enough to substantially limit the current therethrough if the capacitor should be short-circuited and, further, to supply the remaining capacitors with sufficient and appropriate test voltage although a neighboring capacitor may be short-circuited, and thus draw more current through its resistor—in other words, the overall voltage supply should not be severely impaired by excessive current through any one of the resistors 6 due to a shorted capacitor.

To test the plurality of capacitors, it is necessary to interrupt one of the connecting pins, as shown, that is to break connecting pin 5b so that it can be connected by the spring terminal clip 8 to the appropriate resistor 6. The uninterrupted connecting wire or pin 5a, connected to the strip 1, forms either the return path for a capacitor which is short-circuited, or the second terminal to sense charge current upon first connecting a d-c source to the group of capacitors. The strip 1 is connected to the appropriate terminal 9 by suitable contact springs, as well known, and not specifically shown since any constructional arrangement capable of making electrical connection with a conductive strip is suitable.

Various changes and modifications may be made within the scope of the inventive concept.

The strip 4 may also be made of insulating material with only a conductive surface, in which the conductive surface is subdivided into two surface portions. One portion may be of highly electrically conductive material, for connection to the terminal pin 9a, the other conductive surface portion being formed as a thick-film connection track 7, with the resistance projections 6 extending therefrom and terminating in the spring clips 8, for engaging with the foreshortened pins 5b of the test element 2. Of course, the conductive strip may also be made as a multiple-strip element, carrying the conductive portions, and in part made of silicon-chromium-aluminum alloy. An insulating coating or layer 20, shown in fragmentary form only for clarity of the drawing, can be used to separate the track 7 the pins 5a, the resistors 6 and the spring clips 8 from the conductive strip 4. While it is possible to replace the insulating strip 3 on clamp B by a conductive strip carrying the tracks 7, resistors 6 and the clips 8, a flexible wire connection is then needed between the two jaws, and the simple direct connection of the terminals 9, on only one of the jaws will be lost. The arrangement, thus, in which the jaw A carries the conductive strip or rail 4 which, as noted, may be in two separate conductive portions for direct connection to the terminal pins 9 on one single jaw is preferred.

A suitable material to form the clamping jaws A, B, with the wings 15a, 15b, integrally molded thereon, is a fiber, plastic-reinforced material known as No. 2082 in accordance with German industrial standard (DIN) 7735.

The track 7, resistors 6, and, if desired, spring terminals 8, can also be secured to carrier strip 1 and placed against an insulated portion of strip 4, track 7 being connectable to one of prongs 9.

We claim:
1. An article of manufacture comprising
    a test clamp unit for simultaneously clamping and testing a plurality of components (2) mounted on a carrier strip and having projecting connection pins (5a, 5b), including
    two elongated clamping jaws (A, B) movable between a clamped and a released position and having facing surfaces of insulating material;
    a first connecting track (4) having a conductive surface, arranged on the facing surface of one (A) of the jaws;
    means for locating the carrier strip (1) in the transverse direction between the clamping jaws;
    a first externally accessible terminal connection means (9a), electrically connected to said conductive surface of the first connecting track (4),
    one of the contact pins (5a) engaging the conductive surface of the first connecting track (4);
    a plurality of electrical contact means (6,8) electrically insulated with respect to said conductive surface of the first connecting track (4) engageable with another one (5b) of the contact pins of the components to be tested, secured to said one (A) of the clamping jaws, and positioned uniformly spaced from each other along the transverse direction of the respective clamping jaw;
    a second connecting track (7) electrically connecting together the plurality of electrical contact means (6,8) arranged in said one (A) of the jaws;
    a second externally accessible terminal connection means (9b), electrically connected to said second connecting track (7); and
    means (15b) for clamping the carrier strip (1) and the electrical components thereon between said clamping jaw upon movement of said jaws into clamped position.

2. The article of manufacture according to claim 1, wherein said carrier strip includes a longitudinal holding strip, the components (2) being secured to said holding strip by means of at least one of the contact pins of the components.

3. The article of manufacture according to claim 1, wherein the holding strip (1) is an elongated element, the components have two terminal pins (5a, 5b) and are secured to said holding strip by one electrically continuous pin (5a) to permit application of electrical energy to the electrical components via said first electrical connecting track (4).

4. The article of manufacture according to claim 1, wherein the electrical connection means includes spring elements (8) engageable with one (5b) of the contact pins of the respective electrical components.

5. The article of manufacture according to claim 1, wherein the electrical connectin means (6,8) include resistance elements connectable in series between the second terminal connection means (9b) and said other one of the contact pins (5b) of the component to be tested.

6. The article of manufacture according to claim 1, wherein the first connecting track (4) comprises a strip of silicon-chromium-aluminum alloy.

7. The article of manufacture according to claim 1 wherein the other (B) of the jaws (A, B) includes a strip of insulating material comprising at least one of the materials of the group consisting of: plastics, ceramic.

8. The article of manufacture according to claim 1 wherein said clamping jaws (A,B) comprise fiber-reinforced plastic material;

and the means for clamping comprise spring means (12), holding said clamping jaws in clamped position, said clamping jaws including wings (15a, 15b) projecting from the clamping jaws and permitting, upon releasing movement of the clamping jaws, spreading the jaws to release a carrier strip (1), with electrical components (2) thereon, from clamped position between said jaws.

9. The article of manufacture according to claim 1 wherein said first and second connecting tracks (4,7) comprise insulating material having two electrically conductive surface portions thereon, one surface portion (4) being engageable with said one of the contact pins (5a) of the components (2) to be tested, the other surface portion (7) being engageable with an other (5b) of the contact pins of the components and forming part of said electrical connection means.

10. The article of manufacture according to claim 9 wherein said other surface portion comprises finger-like projecting resistance elements (6) extending from the second connecting track (7) commonly connected to all said resistance elements (6), said connecting track strip being connected to the second terminal connection means (9b);

and spring terminal connectors (8) connected to the individual resistor elements (6) for connection, individually, to the other contact pins (5b) of the elements to be tested.

11. The article of manufacture according to claim 1 wherein said one jaw (A) includes an elongated element of insulating material with two electrically conductive surface portions (4,7) thereon, one surface portion forming said first connecting track (4) and being engageable with said one of the contact pins (5a) of the components (2) to be tested, the other surface portion (7) forming the second connecting track and being engageable with the other (5b) of the contact pins of the components and forming part of said electrical connection means.

12. The article of manufacture according to claim 11, wherein said other surface portion comprises finger-like projecting resistance elements (6) and said connecting track (7) is commonly connected to all said resistance elements, said connecting track being connected to the second terminal connection means (9b);

and spring terminal connectors (8) connected to the individual resistor elements (6) for connection, individually to the other contact pins (5b) of the elements to be tested.

13. The article of manufacture according to claim 1 wherein said second connecting track (7) comprises a conductive film;

and an insulating coating (20) over said conductive film.

14. The article of manufacture of claim 1 wherein said connecting track (7) comprises a thick-film connection track having finger-like resistance projections (6) extending therefrom, said resistance connections being electrically connected to said electrical contact means (8); p1 and an insulating layer (20) over said thick-film connecting track (7).

* * * * *